United States Patent [19]

Smith et al.

[11] Patent Number: 4,890,309
[45] Date of Patent: Dec. 26, 1989

[54] LITHOGRAPHY MASK WITH A $\pi$-PHASE SHIFTING ATTENUATOR

[75] Inventors: Henry I. Smith, Sudbury; Erik H. Anderson, Cambridge; Mark L. Schattenburg, Brookline, all of Mass.

[73] Assignee: Massachusetts Institute of Technology, Cambridge, Mass.

[21] Appl. No.: 18,587

[22] Filed: Feb. 25, 1987

[51] Int. Cl.$^4$ .......................... B05D 3/06; G03F 9/00
[52] U.S. Cl. ........................................ 378/35; 378/34; 250/505.1
[58] Field of Search ............... 378/34, 35; 350/448, 350/162.11; 430/5; 250/505.1

[56] References Cited

U.S. PATENT DOCUMENTS

| | | | |
|---|---|---|---|
| 3,743,842 | 7/1973 | Smith et al. | 250/320 |
| 4,360,586 | 11/1982 | Flanders et al. | 378/35 |
| 4,388,728 | 6/1983 | Emmanuel | 378/34 |
| 4,488,799 | 8/1984 | Hams et al. | 378/35 |
| 4,514,857 | 4/1985 | Kimura et al. | 378/34 |

OTHER PUBLICATIONS

"The Phase-Shifting Mask II: Imaging Simulations and Submicrometer Resist Exposures", M. D. Levenson et al., IEEE Trans. on Elec. Dev. vol. 31, No. 6, (1984).
"Electron-Beam X-ray, & Ion-Beam Techniques for Submicrometer Lithographies V", R. Radaelli et al., SPIE, vol. 632.
"High-Resolution X-Ray Lithography Using a Phase Mask", Y. Yamakoshi et al., App. Optics, vol. 25, No. 6, (1986).
"Optical Imaging with Phase Shift Masks", M. Prouty et al., SPIE, vol. 420, (1984).

Primary Examiner—Janice A. Howell
Assistant Examiner—Joseph A. Hynds
Attorney, Agent, or Firm—Fish & Richardson

[57] ABSTRACT

The mask includes an attenuator which passes a fraction of the incident electromagnetic radiation and phase shifts the radiation relative to the radiation passing through open features of the mask by approximately an odd multiple of $\pi$ radians. This phase shifting of light passing through the attenuator by $\pi$ radians reduces the edge blurring that results from diffraction effects. The present invention steepens the slope of the intensity profile at the edges of features in x-ray lithographic replication relative to the slope obtained with a conventional x-ray mask. The steeper slope is a highly significant advantage because it permits improved linewidth control.

18 Claims, 7 Drawing Sheets

Mask for Soft X-ray ($\lambda \sim 1$ rm) Lithography

LITHOGRAPHY MASK WITH A π-PHASE SHIFTING ATTENUATOR

The Government has rights in this invention pursuant to Grant Number DAAL03-86-K-0002 awarded by the Department of the Army.

BACKGROUND OF THE INVENTION

X-ray lithograph (U.S. Pat. No. 3,743,842, July 3, 1973) is a technique in which a pattern in an x-ray attenuator located on a membrane that is relatively transparent to x rays, is replicated in a radiation sensitive film (usually called a resist) by passing x rays through, such that the shadow of the attenuator pattern is cast into the resist. The combination of membrane and patterned attenuator is called the x-ray mask. Usually, the exposure of the resist by the x-rays results in a change in solubility such that after development in a solvent the pattern of the x-ray attenuator is replicated in the resist as a relief image.

In x-ray lithography, diffraction is significantly reduced relative to ultraviolet lithography because of the short wavelength of the x rays (in the range 0.4 to 5 nm). However, diffraction cannot be ignored altogether, especially as the need for deep submicron linewidths, and sub 0.1 $\mu$m linewidths, arises. Diffraction, as well as penumbral edge blurring due to the finite source size, can be reduced by reducing the mask-to-sample gap, S. In fact, in our research laboratory practice of x-ray lithography this gap is commonly made zero. However, in industrial practice, one would like to have a relatively large gap, for example in the range 3 to 50 $\mu$m. A non-zero gap is desirable so as to avoid mutual mask/sample damage such as scratching. The purpose of this invention is to provide a novel configuration of x-ray mask in which the deleterious effects of diffraction are significantly reduced relative to conventional x-ray masks. This invention will allow one either to use a larger gap while achieving a given minimum linewidth, or, for a given gap, to achieve a smaller minimum linewidth. This invention also provides improved control of linewidth and improved latitude of processing.

The x-ray shadow cast onto a surface (so called recording surface) by an x-ray attenuator pattern is a faithful replica if the gap, S, between the attenuator and the recording surface is close to zero. At the edge of any feature in the pattern, the slope of the intensity profile is extremely steep. If, however, the gap, S, is increased significantly, the intensity profile will be changed as a result of diffraction. Specifically, the slope of the intensity profile will be less steep. The invention described here provides a means for steepening the slope of the intensity profile at the edges of features in x-ray lithographic replication relative to the slope obtained with a conventional x-ray mask. A steeper slope is a highly significant advantage because it permits improved linewidth control.

This invention results from the recognition that the x ray wave that passes through the x-ray attenuator experiences a shift in phase relative to the x ray wave that passes through the open, non-attenuating, portions of an attenuator pattern, and that if this relative phase shift is adjusted to have a value close to $\pi$ radians, some of the deleterious effects of diffraction will be suppressed. In particular, the slope of the intensity profile will be steeper than if the relative phase difference were other than $\pi$ radians.

SUMMARY OF THE INVENTION

According to the invention one intentionally chooses the material of the x-ray attenuator and its thickness such that the attenuation is less than 100% (90% is a possible choice) and the phase of the x rays passing through the attenuator is shifted by approximately $\pi$ radians (or an odd multiple thereof) relative to the phase of the x rays passing through the open or non-attenuating spaces in the x-ray attenuator. The choice of attenuator material and its thickness depend on the wavelength of the x ray source since both x-ray attenuation and phase shift vary with wavelength. The x-ray attenuator can be either a homogeneous absorber such as tungsten, W, or gold, Au, or it can be a multilayer film such that the attenuation introduced into the x ray beam passing through the mask is due in part to back reflection of x rays from the multilayer film.

BRIEF DESCRIPTION OF THE DRAWINGS

FIG. 6a is for the case where the gap, S, between attenuator and the recording surface is close to zero; FIG. 6b is for a finite gap of 20 $\mu$m; FIG. 6c is also for a gap of 20 $\mu$m but the attenuator is made according to the principle of the invention disclosed here.

DETAILED DESCRIPTION OF PREFERRED EMBODIMENTS

Figure 1A:
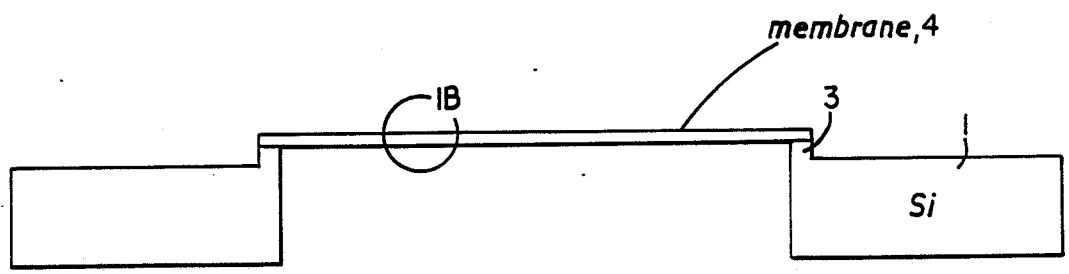
FIG. 1 is a cross-sectional drawing of an x ray mask with an inset showing additional fine details.
Figure 1B:
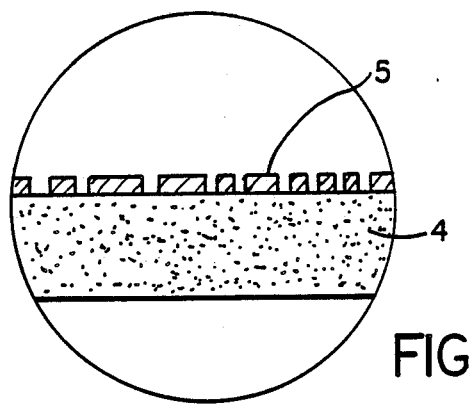

With reference now to FIG. 1 we show a possible configuration of an x-ray mask. A silicon wafer substrate 1 is etched so as to provide an open circular hole, 2, and a raised rim, 3. Across this rim a membrane, 4, of an x-ray mask is suspended. The membrane 4 should be under a slight tensile stress so as to ensure flatness, and should have reasonable mechanical strength.

Some materials which have been used as membranes are Si itself (see U.S. Pat. No. 3,742,230, June 25, 1976) SiC, $Si_3N_4$ doped with hydrogen, BN and polyimide (U.S. Pat. No. 4,170,512, Mar. 3, 1981). Carbon, diamond-like carbon, and diamond itself would also be a suitable material for the membrane. The membrane will most often be in the thickness range 1–10 $\mu$m in order to minimize the amount of absorption that it introduces.

Figure 2:
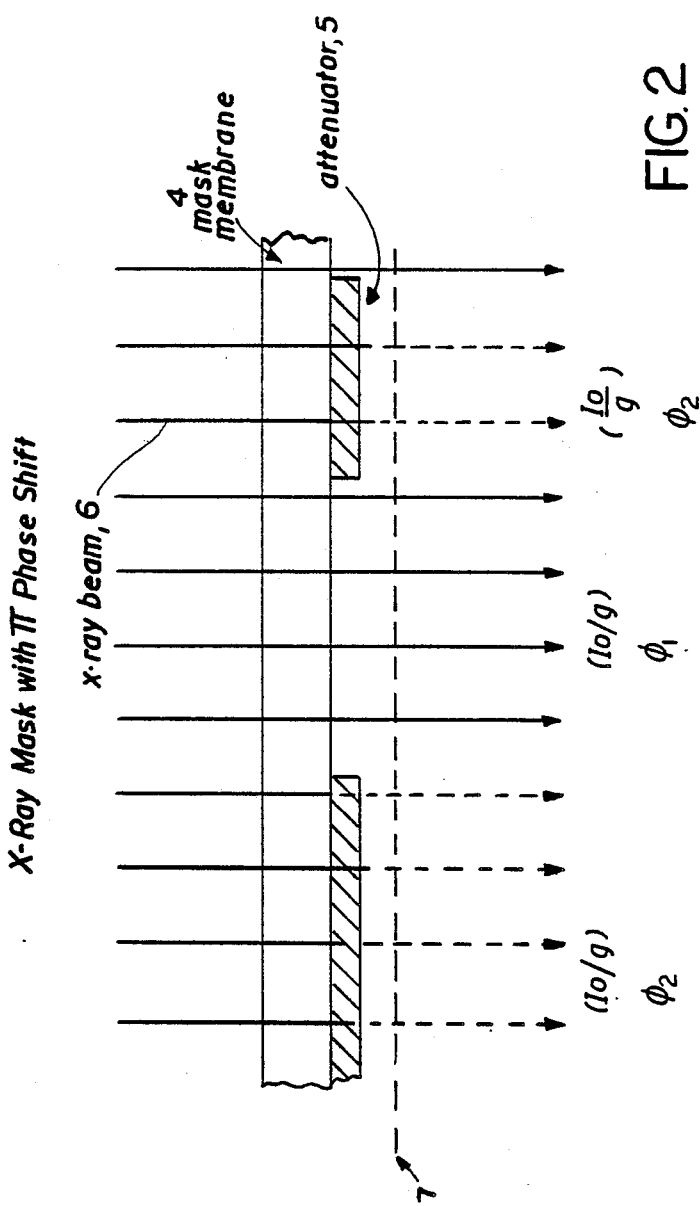
FIG. 2 is a cross-sectional drawing illustrating the intensities and the phases of x rays downstream of the x-ray attenuator and downstream of a non-attenuating features on an x-ray mask.

On top of the membrane, as shown in the inset, an attenuator material, 5, is formed into a desired pattern. Many configurations for suspending the membrane of the x-ray mask have been described in the literature. The method of suspending the membrane is not a special feature of this invention. Rather, this invention is concerned with the construction of the attenuator and its attenuating and phase-shifting properties. Gold (Au) and tungsten (W) are suitable as attenuators. These materials are commonly used in x-ray masks and are generally homogeneous. They attenuate by absorption since back reflection and scattering are small; in fact, effectively negligible in the context of lithography. The attenuation should be somewhere in the range 3–30 db. Contrary to intuition, the partial attenuation exploited in the present invention gives better results than would total attenuation. For the purpose of this invention we find an attenuation of 10 db, as depicted in FIGS. 2 and 6, is suitable to illustrate the effectiveness of our invention, although we do not assert that such an attenuation is optimal. Rather, the optimal attenuation would depend on the specific application.

The attenuator can also be made as a multilayer film for the purpose of reflecting the incident x rays and transmitting only a predetermined percentage, such as 10% for example. Multilayer films and their use as x ray reflectors have been described widely in the scientific literature (see, for example, Troy W. Barbee, "Synthesis of Multilayer Structures by Physical Vapor Deposition Techniques," pp. 330, *Synthetic Modulated Structures*, eds. L.L. Chang nd B.C. Giessen, Academic Press, 1985). The idea of using multilayer films for the specific purpose of attenuating x rays in an x-ray mask configuration is novel. For this purpose the multilayer should consist of alternating layers of a high atomic number material, such as tungsten, W, and a low atomic number material, such as carbon.

FIG. 2 illustrates the basic idea of the invention. An x-ray beam, 6, passes through the mask membrane, 4, suffering a relatively small amount of attenuation in the process. The intensity of the beam downstream of the membrane, 4, is designated $I_o$, and this is the intensity of that portion of the beam which passes through the slit feature that is patterned into the attenuator. That portion of the beam which passes through the attenuator, 5, is reduced in intensity. FIG. 2 shows this reduced intensity as ($I_o/g$). A choice for the value of g could be 10, a value we use in this description to illustrate the principle of this invention. The dotted line, 7, in FIG. 2 represents a plane immediately in front of the x ray mask. It is a well known principle of optics that any beam, such as the x-ray beam, 6, can be considered as being composed of a superposition of one or more plane waves, each of which may have a different phase at the plane 7. Considering one such plane wave, its phase at the plane 7 is designated $\phi_1$ downstream of the feature or opening in the attenuator. Downstream of the attenuator, the phase is designated $\phi_2$. The most important aspect of this invention is to choose the absolute value of the difference between $\phi_1$ and $\phi_2$ to be close to an odd multiple of $\pi$ radians. That is, $$|\phi_2 - \phi_1| = \pi(2n+1), \quad (1)$$

where n is zero or any positive integer. We can also express equation 1 by saying that the attenuator introduces a relative phase shift of approximately $\pi$ radians. Those skilled in the art will recognize that a relative phase shift of exactly $\pi$ radians will give optimum results with performance decreasing somewhat as the relative phase shift differs incrementally from $\pi$ radians.

Figure 3:
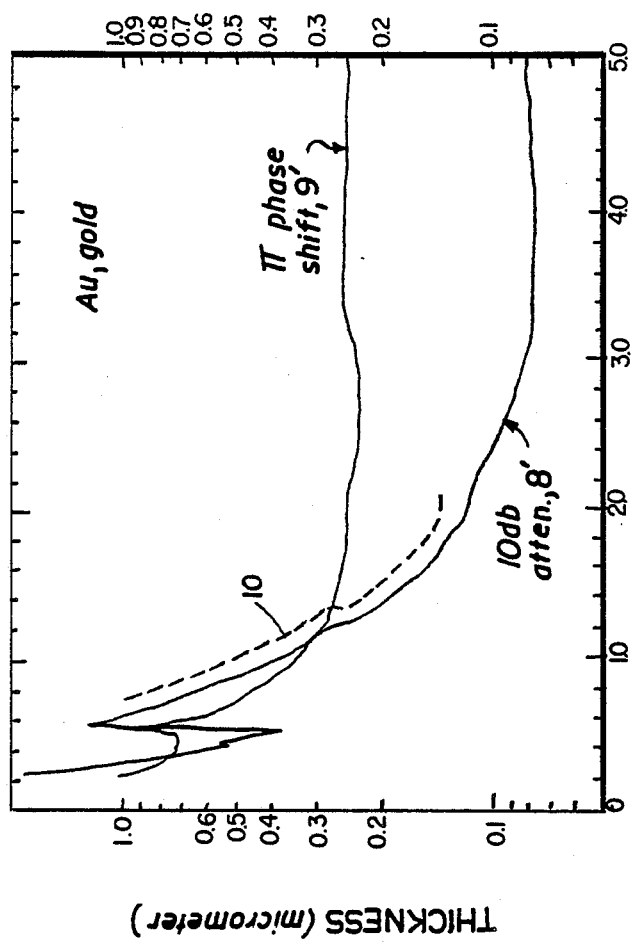
FIG. 3 is a semilogarithmic plot in which the ordinate is the thickness of gold in micrometers, and the abscissa is the x-ray wavelength in nanometers. The curve marked "10 db atten." gives the thickness of gold that provides 10 db attenuation (i.e., the intensity downstream is 10% of the intensity incident from upstream on the attenuator). The curve marked "$\pi$-phase shift" gives the thickness required to provide a phase shift of $\pi$ radians.
Figure 4:
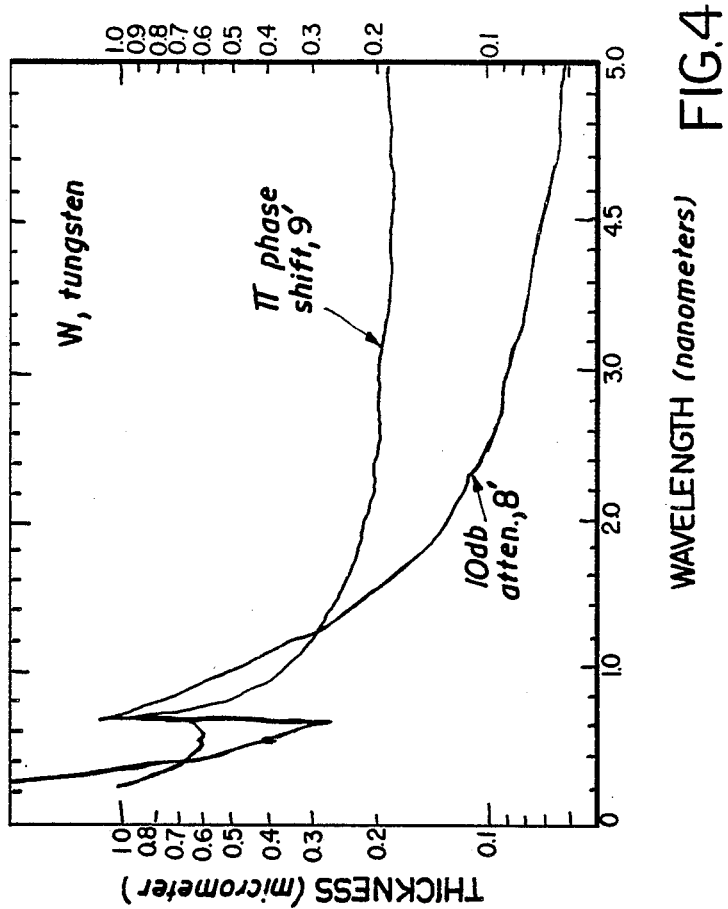
FIG. 4 is a semilogarithmic plot in which the ordinate is the thickness of tungsten in micrometers, and the abscissa is the x-ray wavelength in nanometers. The curve marked "10 db atten." gives the thickness of tungsten that provides 10 db attenuation (i.e., the intensity downstram is 10% of the intensity incident from upstream on the attenuator). The curve marked "$\pi$-phase shift" gives the thickness required to provide a phase shift of $\pi$ radians.

Choosing g to have the value 10 (that is, the attenuation of the attenuator is 10 db), we can now refer to FIG. 3. The curve marked 8 gives the thickness of gold required to provide 10 db attenuation ploted as a function of x-ray wavelength. The curve marked 9 gives the thickness of gold required to provide a $\pi$ phase shift, as defined in equation 1, also plotted as function of x-ray wavelength. The point where the two curves cross gives the thickness of gold that will provide both 10 db attenuation and $||\phi_2 - \phi_1|| = \pi$. According to FIG. 3 this occurs at a gold thickness of about 0.29 micrometer, and a wavelength of about 1.15 nm. (The plots of FIGS. 3 and 4 are slightly shifted from those in the Ph.D. thesis of M. Schattenburg, "Astronomical X-ray Spectroscopy: Studies of the Crab Nebula and Development of Ultra-fine Transmission Gratings," M.I.T., 1984, who obtained data on x ray attenuation from the open literature and calculated phase shift from the well-known Kramers-Kronig relation. Schattenburg's plots were for 3 db attenuation rather than 10 db as given here.)

In actual practice, one would usually have an x ray wavelength or a band of wavelengths at one's disposal, for example, the copper L x ray line at 1.33 nm. Another example would be a portion of the broad band of wavelengths emanating from a snychrotron, or the cluster of lines emanating from a laser-produced plasma. In the event that the wavelength of the source does not match up with the point where the curves 8 and 9 cross, one can accept a different value of g, as indicated by the dotted line, 10, in FIG. 3 which crosses curve 9 at the copper L line (1.33 nm). In this case, curve 10 corresponds to about 13 db attenuation. Alternatively, the material out of which the x ray attenuator is made could be altered. FIG. 4 shows, for example, that the point where curves 8' and 9' cross occur at a wavelength of about 1.3 nm for W. Mixtures of alloys or absorber materials would allow the crossing point to be moved around quite readily. The mixtures could, for example, be alternating layers of gold and silver, or alloys thereof, alloys of Cu and Au or a wide variety of other combinations. Once the percentage of atomic constituents is known curves such as given in FIGS. 3 nd 4 could be generated according to the principle described in the Ph.D. thesis of Schattenburg referred to above.

Figure 5:
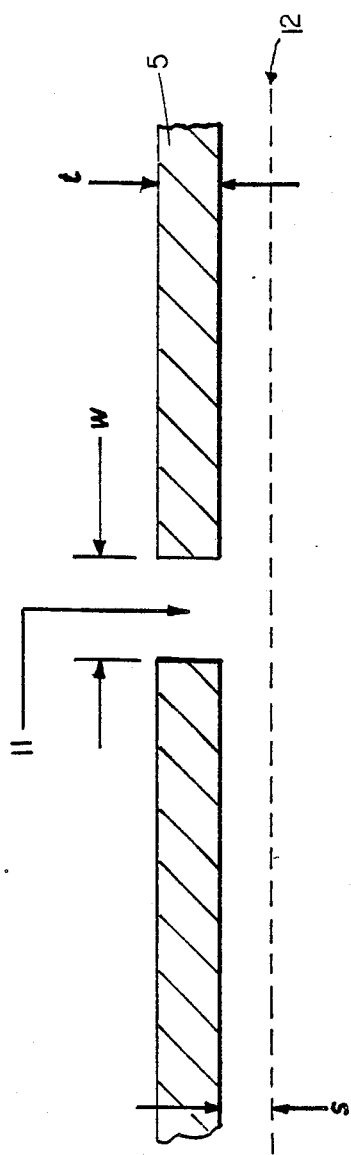
FIG. 5 is a cross-sectional drawing of an x-ray mask with attenuator film patterned in the form of a narrow slit; and a recording surface separated from the attenuator by a gap, S.
Figure 6A:
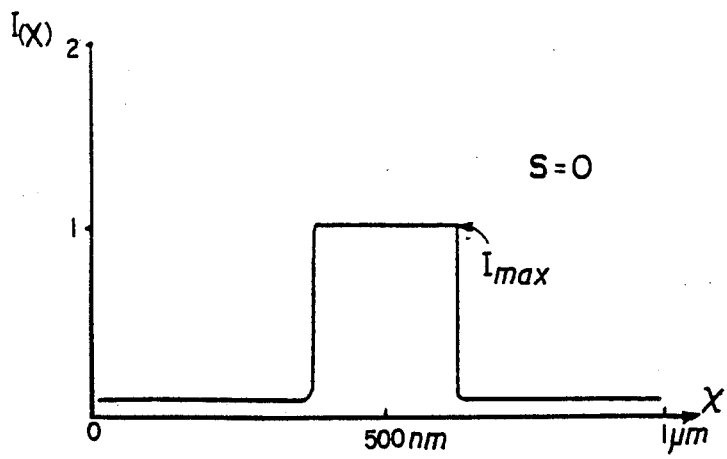
FIGS. 6a, 6b, and 6c consist of plots of the calculated x-ray intensity, I(x), downstream of the x-ray mask of FIG. 5, where x is linear distance perpendicular to the axis of the slit.
Figure 6B:
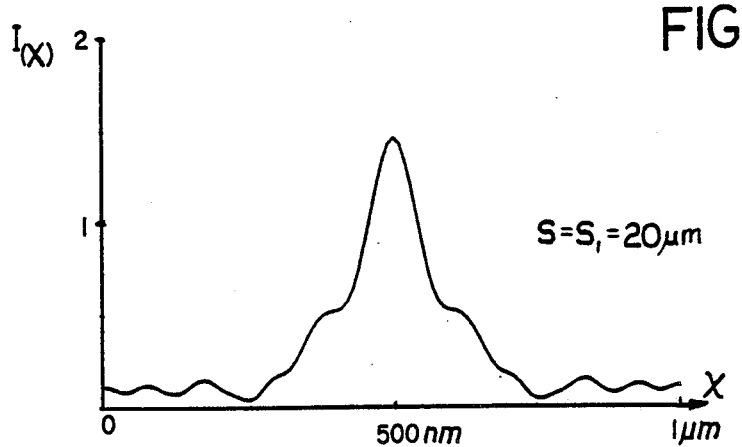
Figure 6C:
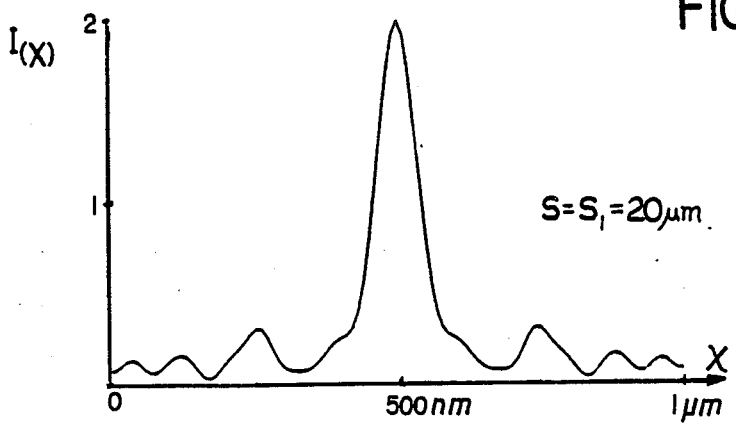

FIG. 5 is a cross-sectional drawing of a slit, 11, having a width W in an x-ray attenuator, 5, having a thickness, t. For clarity, the membrane that supports the x-ray attenuator is not shown in this figure. Separated from the x-ray attenuator by a distance, S, and downstream of it, is recording surface, 12. In the event that S is approximately zero, the distribution of x-ray intensity, I(x), on the recording plane 12 will be as depicted in FIG. 6a, which is based on a calculation. In this example we have chosen W to be 0.25 $\mu$m and the x-ray wavelength to be 1.2 nm. Actually, the calculation was for a band of wavelengths centered at 1.2 nm with the band extending +3% and −3% on both sides of 1.2 nm. In FIG. 6b we show the x-ray intensity distribution that results if the gap, S, is changed from zero to $S_1$, which is equal to 20 μm, and the relative phase shift of the x rays in passing through the attenuator is zero. A phase shift of zero is intended to depict the result that would be obtained with a conventional x-ray mask. FIG. 6c shows the intensity distribution that results when the relative phase shift is $\pi$ radians, according to the principle of this invention. In this plot the gap S is again $S_1$, which s equal to 20 μm, as in FIG. 6b. The only change between 6b and 6c is that the attenuator introduces a relative phase shift of $\pi$.

In practice, an intensity profile such as depicted in FIG. 6c is far more desirable than the one depicted in FIG. 6b because it permits better control of linewidth, an important figure of merit in modern microlithography. The steeper slope of the intensity distribution at the edges of features achieved by this invention is a significant advantage. Among other advantages it allows a practitioner to achieve a desired linewidth over a wide range of process parameters, thereby improving yield or reducinig the cost of manufacture.

In FIG. 6 we took as an example a median wavelength of 1.2 nm, a slit width of 0.25 μm and, in 6b and 6c a gap, $S_1$, of 20 μm. The results of FIG. 6 can be scaled to other slit widths by noting that W is 208 times the median wavelength and $S_1$ is equal to 16,667 times the median wavelengh. The same plots would be obtained for other values of W and $S_1$ provided W and $S_1$ are the same multiples of the source wavelength.

In all of the above descriptions of our invention we have not included discussion of the deleterious effects of penumbral blurring of the edges of features. Penumbral blurring has been discussed in U.S. Pat. No. 3,743,842. The present invention deals only with reducing the edge blurring that results from diffraction. It is well known to anyone skilled in the art or to one familiar with U.S. Pat. No. 3,743,842 that penumbral effect can be made arbitrarily small by arranging for the x-ray source to subtend a sufficiently small solid angle as viewed from the recording plane. Alternatively, if a synchrotron is used as an x-ray source penumbra is negligible because a synchrotron emits collimated radiation.

FIG. 6 displays the advantages of our invention for the case where the feature on the mask is a simple slit. For geometric features other than slits, our invention would still provide the advantage of steepening the intensity distribution at the feature edges, and thus would provide improved control of dimensions in the final image.

Figure 7:
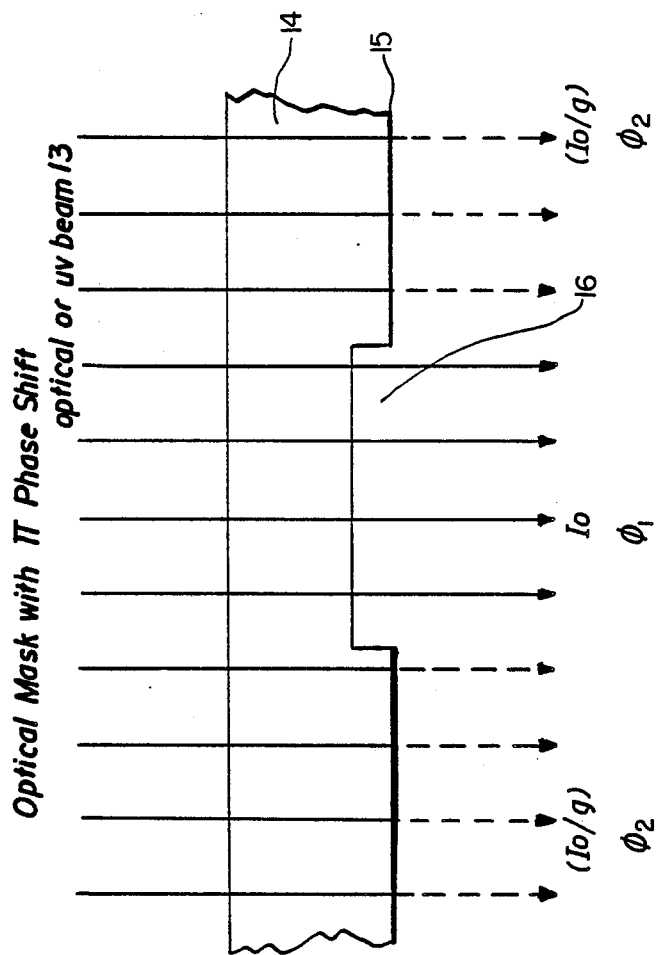
FIG. 7 is a cross-sectional drawing illustrating the intensities and the phases of optical or UV beams downstream of a mask made according to the principles of this invention.

The physics underlying the present invention is substantially the same in the domain of optical and ultraviolet radiation. Thus, a reduction of the deleterious effects of diffraction in optical and UV projection or proximity printing can be achieved by the same principle: allow the attenuator to transmit a small fraction of the incident radiation and also arrange that the radiation have a phase shift of approximately $\pi$ radians relative to radiation passing through open features of a mask. In conventional practice, masks for the optical and UV ranges are made on glass or quartz and the attenuator is typically chromium, several hundred angstroms thick. The thickness is chosen so that the amount of light transmitted is negligible (typically less than 0.1%). An improved mask, according to the principles of our invention, would have an attenuator that transmitted several percent. The attenuator could be, for example, an ultrathin film or chromium or other metal. Some phase shift will take place as the light passes through the metal film although, in general, it will not be $\pi$ radians or an odd multiple thereof, as required by our invention. Therefore, some means of introducing additional phase shift is required for our invention to be effective in the optical and UV regions. FIG. 7 illustrates a scheme for doing so that we have implemented in the laboratory. The optical or UV beam, 13, passes through the glass or quartz, 14, with substantially zero attenuation. In passing through the ultrathin metal film, 15, the intensity is reduced from $I_o$ to $(I_o/g)$, and the phase is $\phi_2$. A relief structure, 16, in the glass adjusts the phase of the nonattenuated portion of the light such that the relative phase shift $|\phi_2 - \phi_1|$ is an odd multiple of $\pi$ radians. A reasonable choice for the value of g would be 10. The optimal choice will depend on the specific application. Such masks can be used in optical projection systems.

There has been described novel structures and techniques for reducing the deleterious effects of diffraction in x-ray lithography. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Lithography mask including open features and an attenuator whose material and thickness are selected to both pass a fraction of incident electromagnetic radiation and to phase shift the radiation relative to radiation passing through the open features of the mask by approximately an odd multiple of $\pi$ radians in order to reduce deleterious diffraction effects.

2. The lithography mask of claim 1 wherein the electromagnetic radiation is x-rays.

3. The lithography mask of claim 2 wherein the attenuator is an x-ray absorber.

4. The lithography mask of claim 2 wherein the attenuator is a multilayer film resulting in attenuation through back reflection.

5. The lithography mask of claim 3 wherein the absorber is homogeneous.

6. The lithography mask of claim 5 wherein the attenutator is tungsten.

7. The lithography mask of claim 5 wherein the attenuator is gold.

8. The lithography mask of claim 3 wherein the attenuator comprises alloys or gold and silver.

9. The lithography mask of claim 3 wherein the attenuator comprises alternating layers of gold and silver.

10. The lithography mask of claim 3 wherein the attenuator comprises alloys of copper and gold.

11. The lithography mask of claim 3 wherein the attenuator comprises alternating layers of copper and gold.

12. The lithography masks of claim 4 wherein the multilayer film comprises alternating layers of a high atomic number material and a low atomic number material.

13. The lithography mask of claim 12 wherein the high atomic number material is tungsten and the low atomic number material is carbon.

14. X-ray lithography mask including open features and an attenuator whose material and thickness are selected to both pass a fraction of the incident x-rays and to phase shift the x-rays relative to those passing through open features of the mask by approximately an odd multiple of $\pi$ radians in order to reduce deleterious diffraction effects.

15. The x-ray lithography mask of claim 14 wherein he attenuator is an x-ray absorber.

16. The x-ray lithography mask of claim 14 wherein the attenuator is a multilayer film adapted to attenuate x radiation by back reflection.

17. The lithography mask of claim 2 wherein the attenuator transmits approximately 10% of the incident radiation.

18. Mask for optical and ultra-violet radiation comprising a transparent substrate and an attenuator pattern on the substrate, in which, in order to reduce deleterious diffraction effects, the material and thickness of the attenuator pattern are selected to pass a fraction of the incident radiation, and the open features of the transparent substrate include a relief portion adjusting the phase of the non-attenuated portion of the radiation such that the relative phase shift between the attenuated and non-attentuated radiation is approximately an odd multiple of $\pi$ radians.

* * * * *